US00RE36027E

United States Patent [19]

Arimoto et al.

[11] E Patent Number: Re. 36,027

[45] Reissued Date of Patent: Jan. 5, 1999

[54] RANDOM ACCESS MEMORY OF A CSL SYSTEM WITH A BIT LINE PAIR AND AN I/O LINE PAIR INDEPENDENTLY SET TO DIFFERENT PRECHARGE VOLTAGES

[75] Inventors: Kazutami Arimoto; Kazuyasu Fujishima; Hideto Hidaka; Masaki Tsukude; Tsukasa Ohishi, all of Tokyo, Japan

[73] Assignee: Mitsubishi Denki Kabushiki Kaisha, Tokyo, Japan

[21] Appl. No.: 664,081

[22] Filed: Jun. 13, 1996

Related U.S. Patent Documents

Reissue of:

[64] Patent No.: 5,321,657
Issued: Jun. 14, 1994
Appl. No.: 865,145
Filed: Apr. 8, 1992

[30] Foreign Application Priority Data

Apr. 9, 1991 [JP] Japan ..... 3-106789

[51] Int. Cl.[6] ..... G11C 7/00

[52] U.S. Cl. ..... 365/203; 365/189.11; 365/230.03

[58] Field of Search ..... 365/203, 230.03, 365/189.11

[56] References Cited

U.S. PATENT DOCUMENTS

| | | | |
|---|---|---|---|
| 4,112,512 | 9/1978 | Arzubi et al. | 365/203 |
| 4,658,381 | 4/1987 | Reed et al. | 365/203 |
| 4,780,852 | 10/1988 | Kajigaya et al. | 365/203 |
| 4,926,384 | 5/1990 | Roy | 365/203 |
| 4,996,671 | 2/1991 | Suzuki et al. | 365/203 |
| 5,047,984 | 9/1991 | Monden | 365/203 |

OTHER PUBLICATIONS

"An Experimental 1Mb DRAM With On-Chip Voltage Limiter", Itoh, K. et al., *Digest of Technical Papers*, IEEE International Solid-State Circuits Conference, Feb., 1984, p. 282.

*Primary Examiner*—Son T. Dinh
*Attorney, Agent, or Firm*—Lowe, Price, LeBlanc & Becker

[57] ABSTRACT

In a dynamic RAM of a CSL system, a memory array is divided into a plurality of memory array portions, and bit line pairs provided in the respective memory array portions are connected to their corresponding I/O line pairs simultaneously in response to a CSL output. In such an RAM, only the I/O line pair of a memory array portion to be accessed is precharged to the level of $V_{CC}-V_{th}$, while the I/O line pair of a memory array portion not to be accessed is precharged to the level of $\frac{1}{2}\cdot V_{CC}$ which is the same level as the bit line pairs. This makes it possible to achieve a faster data reading operation and also prevent unnecessary currents from flowing between the bit line pairs and the I/O line pair in the unaccessed memory array portion.

8 Claims, 6 Drawing Sheets

RANDOM ACCESS MEMORY OF A CSL SYSTEM WITH A BIT LINE PAIR AND AN I/O LINE PAIR INDEPENDENTLY SET TO DIFFERENT PRECHARGE VOLTAGES

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates generally to random access memories (hereinafter referred to as RAMs) and, more particularly, to a precharge system of input/output lines in an RAM including a memory array divided into a plurality of memory array portions.

2. Description of the Background Art

In recent years, an RAM having a memory array divided into a plurality of memory array portions has been employed in general. FIG. 1 is a diagram schematically showing structure of a conventional MOS dynamic RAM as one example of the RAM thus structured. With reference to FIG. 1, a plurality of memory array portions 2-1, 2-2, . . . , 2-n constituting a single memory array as a whole are formed on a semiconductor chip 1. Sense amplifier portions 3-1, 3-2, . . . , 3-n are formed corresponding to respective memory array portions 2-1, 2-2, . . . , 2-n.

A plurality of CSL (column select line) lines extend from a column decoder 4 through the plurality of memory array portions and the plurality of sense amplifier portion to correspond to respective columns of memory cells constituting the memory array. Column decoder 4 activates one of the plurality of CSL lines, which corresponds to a Y address of a memory cell from which data is to be read, in response to a column (Y) address signal applied from an external address signal source not shown.

A plurality of word lines (WL) extend from a row decoder 5 into their corresponding memory array portions to correspond to respective rows of memory cells constituting the memory array. Row decoder 5 responds to a row (X) address signal applied from an external address signal source not shown to activate one of the plurality of word line, which corresponds to an X address of a memory cell from which data is to be read.

Data read from a single memory cell which is included in any of the memory array portions and specified by those X and Y addresses is applied via a bit line pair not shown to one of sense amplifier portions 3-1, 3-2, . . . , 3-n, which corresponds to the above memory array portion. The applied data is amplified in the corresponding sense amplifier portion and then output to the outside via a corresponding I/O line (data line) pair.

FIG. 2 is a partially enlarged diagram showing a part relating to a certain CSL line, of the entire structure of the dynamic RAM shown in FIG. 1. That is, with reference to FIG. 2, each of the plurality of CSL lines extending from column decoder 4 extends through memory array portions 2-1, 2-2, . . . , 2-n and are connected in common to control inputs of gates 6-1, 6-2, . . . , 6-n corresponding to the respective memory array portions.

A single column which is constituted by a plurality of memory cells (not shown) and provided in each memory array portion (e.g., 2-1) with respect to the single CSL line is connected to a pair of bit lines (BL, $\overline{BL}$). This bit line pair is connected through a sense amplifier SA (e.g., 3-1) and a gate (e.g., 6-1) corresponding to each memory array portion to a pair of I/O lines (I/O, $\overline{I/O}$) corresponding to each memory array portion. Bit line precharge circuits 7-1, 7-2, . . . , 7-n for precharging the above-described bit line pairs (BL, $\overline{BL}$) are provided corresponding to the respective bit line pairs.

Signals on the I/O line pairs are amplified, respectively, by preamplifiers 9-1, 9-2, . . . , 9-n and then output to the outside. I/O line precharge circuits 8-1, 8-2, . . . , 8-n for precharging the above-described I/O line pairs (I/O, $\overline{I/O}$) are provided. It is assumed that with respect also to each of the remaining CSL lines not shown in FIG. 2, the circuits of the same structure as in FIG. 2 are formed.

FIG. 3 is a circuit diagram showing in detail parts relating to first and second memory array portions 2-1 and 2-2 in FIG. 2. A description will now be given on the structure and operation of the first memory array portion 2-1 shown in FIG. 3 and each circuit relating to the first memory array portion.

While memory array portion 2-1 inherently includes a plurality of memory cells arranged two-dimensionally in rows and columns, only one memory cell MC to be accessed is shown in FIG. 3 for facilitating the description. This memory cell MC is provided at a crossing point of a corresponding word line WL and a corresponding bit line BL.

A bit line pair 11-1 constituted by bit lines BL1 and $\overline{BL1}$ is connected through sense amplifier 3-1, bit line precharge circuit 7-1 and gate 6-1 to a corresponding I/O line pair 10-1. Bit line precharge circuit 7-1 includes transistors Q1, Q2 and Q3 which are turned on/off in response to a clock signal BLP1 applied from an internal signal generating source not shown. When those transistors are turned on in response to clock signal BLP1, bit line pair 11-1 is connected via transistors Q1 and Q2 to a precharge voltage source and is further equalized by transistor Q3. As a result, bit lines BL1 and $\overline{BL1}$ are respectively precharged to a bit line precharge voltage $V_{BL}$. This precharge voltage $V_{BL}$ is normally set to a half (½) of a supply voltage $V_{CC}$.

Gate circuit 6-1 includes transistors Q4 and Q5 which are turned on/off in response to a potential on the CSL line extending from column decoder 4. When those transistors are turned on in response to the potential on the CSL line, bit line pair 11-1 is connected via transistors Q4 and Q5 to I/O line pair 10-1.

I/O line pair 10-1 is connected to its corresponding preamplifier 9-1, and this I/O line pair is connected with an equalizing transistor Q6 and I/O line precharge circuit 8-1 in its course. I/O line precharge circuit 8-1 includes transistors Q7 and Q8 which are turned on/off in response to a clock signal IOPC applied from an internal signal generating source not shown. When those transistors are turned on in response to clock signal IOPC, I/O line pair 10-1 is connected via transistors Q7 and Q8 to the above-described precharge voltage source, and I/O line pair (I/O, $\overline{I/O}$) is precharged to the above-described precharge voltage $V_{BL}$. This I/O line pair 10-1 is equalized by transistor Q6 which is turned on/off in response to an equalizing signal EQ applied from an internal signal generating source not shown. The same structure as above is also applied to other memory array portions and their circuits relating thereto.

A description will now be made on an operation of the circuitry of FIG. 3 in a case where a request for access is actually made. The following description is about a case where first memory array portion 2-1 shown in FIG. 3 is accessed, whereas second memory array portion 2-2 is not accessed.

First, in a standby period, a potential on the CSL line of FIG. 3 is at a logic low level, and each bit line pair and each I/O line pair are separated from each other by a gate circuit in any of the memory array portions. Each precharge circuit is activated in response to each type of clock signals, and all the bit line pairs and I/O line pairs are precharged to the above-described precharge voltage $V_{BL}=\frac{1}{2}\cdot V_{CC}$.

When first memory array portion 2-1 is accessed, each of the above clock signals BLP1 and IOPC and equalizing signal EQ attains a logic low level, so that transistors Q1, Q2, Q3, Q6, Q7 and Q8 are turned off. Consequently, both bit line pair 11-1 and I/O line pair 10-1 are separated from precharge voltage source $V_{BL}$ and maintain their respective precharged potentials intactly.

When a potential on word line WL corresponding to memory cell MC from which data is to be read rises, the data stored in the memory cell is read out onto a bit line BL, and a potential difference occurs between paired bit lines BL1 and $\overline{BL1}$. The potential difference is amplified by sense amplifier 3-1. The potential on the corresponding CSL line is subsequently raised to a logic high level by column decoder 4, so that transistors Q4 and Q5 constituting gate 6-1 are turned on. As a result, the data on the bit line pair is transferred via gate 6-1 onto I/O line pair 10-1. The transferred data is then amplified by preamplifier 9-1 and then output to the outside.

In second memory array portion 2-2, clock signals BLP2 and IOPC are at a logic high level, and precharge circuits 7-2 and 8-2 remain activated. That is, both of the potentials on bit line pair 11-2 and I/O line pair 10-2 are kept at $V_{BL}=\frac{1}{2}\cdot V_{CC}$.

Now, if the potential on the CSL line is raised to a logic high level by column decoder 4 as described above, then transistors Q14 and Q15 constituting gate 6-2 are turned on concurrently with the foregoing transistors Q4 and Q5, so that bit line pair 11-2 and I/O line pair 10-2 are connected to each other. Since the potential on bit line pair 11-2 and that on I/O line pair 10-2 are originally the same potential, the respective potentials on bit line pair 11-2 and I/O line pair 10-2 are kept at $V_{BL}=\frac{1}{2}\cdot V_{CC}$ intactly even after gate 6-2 is opened as described above.

As mentioned above, in such an RAM that employs a system (CSL system) in which each connection of a bit line pair and I/O line pair is controlled in common by a signal on a single CSL line of column decoder 4 in both of the memory array portion (e.g., 2-1 of FIG. 3) to be activated and the memory array portion (e.g., 2-2 of FIG. 3) not activated, bit line pair 11-2 and I/O line pair 10-2 are short-circuited in access time also in the inactivated memory array portion (2-2). Accordingly, if a precharge level of the bit line pair is different from that of the I/O line pair, a current flows between the bit line pair and the I/O line pair in accordance with the rising of the potential on the CSL line also in the memory array portion not to be accessed, resulting in an increase in consumption of currents.

Thus, in the conventional RAM, the precharge level of the bit line pair and that of the I/O line pair are set to the same level ($\frac{1}{2}\cdot V_{CC}$), thereby preventing such unnecessary consumption of currents. As described above, such an approach that the precharge level of the I/O line pair is set to the level of $\frac{1}{2}\cdot V_{CC}$ like the precharge level of the bit line pair in the RAM of the CSL system is disclosed in, for example, "An Experimental 1 Mb DRAM with On-Chip Voltage Limiter" by K. Itoh et al. on page 282 of Digest of Technical Papers of 1984 IEEE International Solid-State Circuits Conference.

However, setting the precharge level of the bit line pair and that of the I/O line pair independently to different potentials results in the following merits.

FIG. 4 is a timing chart showing changes in logic level of a bit line pair in the case where a sense amplifier is activated for data reading from memory cell MC; and FIG. 5 is a timing chart showing changes in a logic level of an I/O line pair which has received data from the bit line pair. A description will now be made on merits provided when the respective precharge levels of the bit line pair and the I/O line pair are set to independently different potentials with reference to FIGS. 4 and 5.

First, if a potential on a word line WL (FIG. 4(a)) rises to a level not lower than $V_{CC}$ and word line WL is activated, then charges in a memory cell MC connected to this word line WL are read out onto one bit line BL of the bit line pair. In a case where memory cell MC in memory array portion 2-1 of FIG. 3 has stored data of a logic low level, for example, a potential on bit line BL1 changes by $\Delta V_L$ as shown in FIG. 4(b), while a potential on the other bit line BL1 does not change.

Then, the logic level of bit line BL1 is lowered to a ground potential GND by sense amplifier 3-1, so that the level difference $\Delta V_L$ is amplified (time $t_1$). The logic level of bit line $\overline{BL1}$ is subsequently restored to supply potential $V_{CC}$ by sense amplifier 3-1 (time $t_2$). The reason why a discharge from bit line BL1 of the logic low level is carried out in advance is as follows. That is, assuming an n channel transistor and a p channel transistor having the same dimension, since mobility of electrons is greater than that of holes, the n channel transistor employing electrons as carriers switches at a higher switch speed than the p channel transistor employing holes as carriers and hence it can operate faster.

The data amplified by sense amplifier 3-1, as shown in FIG. 4(b), is transmitted onto I/O line pair 10-1 when gate 6-1 is opened in response to a CSL output of column decoder 4. Then, the potential on this I/O line pair is amplified by a self-amplifying action of sense amplifier 3-1.

FIG. 5(a) indicates a speed of amplification of a potential difference between a pair of I/O lines when the precharge level of the I/O line pair is set to the level of $V_{CC}-V_{th}$ higher than the level of $\frac{1}{2}\cdot V_{CC}$; and FIG. 5(b) indicates a speed of amplification of a potential difference between the pair of I/O lines when the precharge level of the I/O line pair is the level of $\frac{1}{2}\cdot V_{CC}$. In comparison between (a) and (b) in FIG. 5, with respect to time required when the potential difference between the paired I/O lines is amplified up to 200 mV, time $t_3$ in the case where the precharge level of the I/O line pair is $V_{CC}-V_{th}$ is shorter than time $t_4$ in the case where the precharge level is $\frac{1}{2}\cdot V_{CC}$. That is, since discharge is carried out at a higher speed via the n channel transistor of sense amplifier 3-1 in the case with the higher precharge level of the I/O line pair, the potential difference between the paired I/O lines is amplified at a higher speed. This leads to a conclusion that the case with the higher precharge level of the I/O line pair is more advantageous than the case with the lower precharge level.

As mentioned above, in order to achieve a faster data reading operation of the RAM, it is desirable that the precharge level of the I/O line pair is set to the level of $V_{CC}-V_{th}$ higher than $\frac{1}{2}\cdot V_{CC}$ which is the precharge level of the bit line pair. Furthermore, if the precharge levels of both I/O line pair and bit line pair are set to $\frac{1}{2}\cdot V_{CC}$, the load imposed on a $\frac{1}{2}\cdot V_{CC}$ voltage generating circuit will be increased. In such a case, there is a possibility that the I/O line pair may not be precharged sufficiently if the equalizing time period is relatively short. If the capability of the $\frac{1}{2}\cdot V_{CC}$ voltage generating circuit is enhanced, on the other hand, there is a problem of the increase of currents consumed by generating circuit itself. Accordingly, in order to reduce load imposed on a $\frac{1}{2}\cdot V_{CC}$ voltage generating circuit, it is desirable that the level of $V_{CC}-V_{th}$ which can be easily generated is employed as the precharge level of the I/O line pair.

However, if the precharge level of the I/O line pair is set independently of that of the bit line pair, there arises a problem that an unnecessary current flows through the inactive memory array portion unaccessed and thus consumption of currents increases, as described above.

In addition, in order to eliminate such a problem as increased consumption of currents, such structure is considered, unlike the CSL system shown in FIGS. 1–3, that column decoders are provided corresponding, respectively, to a plurality of memory array portions 2-1, 2-2, . . . , 2-n, so as to avoid short-circuits between the bit line pair and the I/O line pair in the unaccessed inactive memory array portion. There is a disadvantage, however, that if a column decoder is provided for each memory array portion, a chip area is substantially increased.

SUMMARY OF THE INVENTION

One object of the present invention is to provide a random access memory achieving a faster data reading operation.

Another object of the present invention is to provide a random access memory of a CSL system which enables a faster operation while suppressing an increase in consumption of currents.

A further object of the present invention is to provide a random access memory of a CSL system which enables a faster operation while suppressing an increase in chip area.

A still further object of the present invention is to provide a random access memory of a CSL system in which a precharge voltage of a bit line pair and that of an I/O line pair can be set independently to different values.

To summarize, the present invention is directed to a random access memory of a CSL system, including: a memory array divided into a plurality of memory array portions; a decoder for selectively accessing any of the plurality of memory array portions; a plurality of bit line pairs for reading data for respective columns from each of the memory array portions; an I/O line pair selectively connected with the plurality of bit line pairs of each of the memory array portions; and a circuit provided for each memory array portion and for precharging the bit line pairs and the I/O line pair to the same potential in non-access time of the corresponding memory array portion and precharging the bit line pairs and the I/O line pair to different potentials in access time.

According to another aspect of the present invention, the precharge circuit precharges the I/O line pair to a potential higher than the potential of the bit line pair in access time of the memory array portion.

Therefore, an advantage of the present invention is that a faster data reading operation can be achieved without causing an increase in consumption of currents or an increase in chip area by precharging the bit line pairs and the I/O line pair to the same potential in non-access time of the memory array portion and precharging the bit line pairs and the I/O line pair to different potentials in access time.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
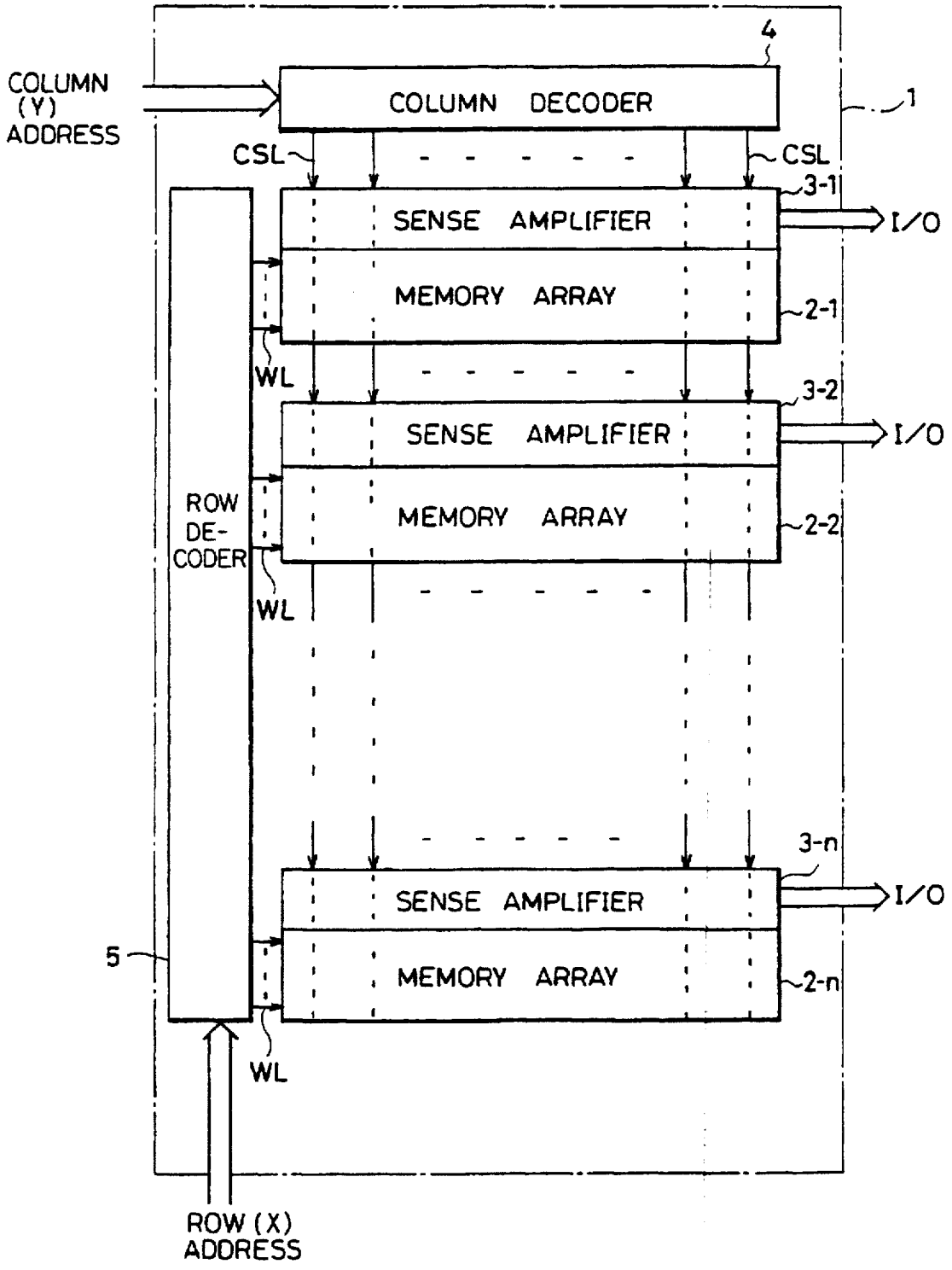
FIG. 1 PRIOR ART
FIG. 1 is a diagram schematically showing structure of a conventional dynamic RAM.
Figure 2:
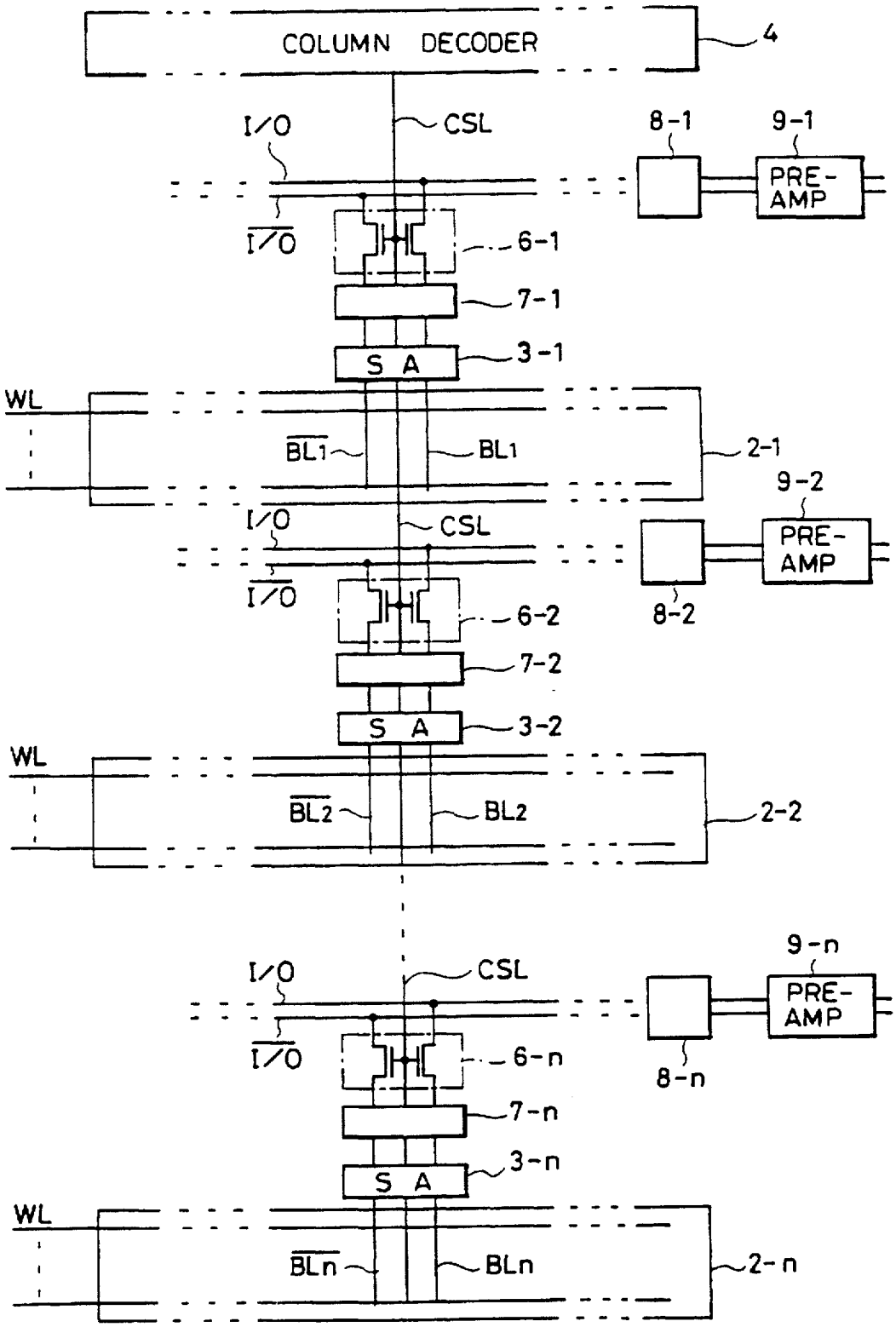
FIG. 2 PRIOR ART
FIG. 2 is a partially enlarged diagram of the dynamic RAM shown in FIG. 1.
Figure 3:
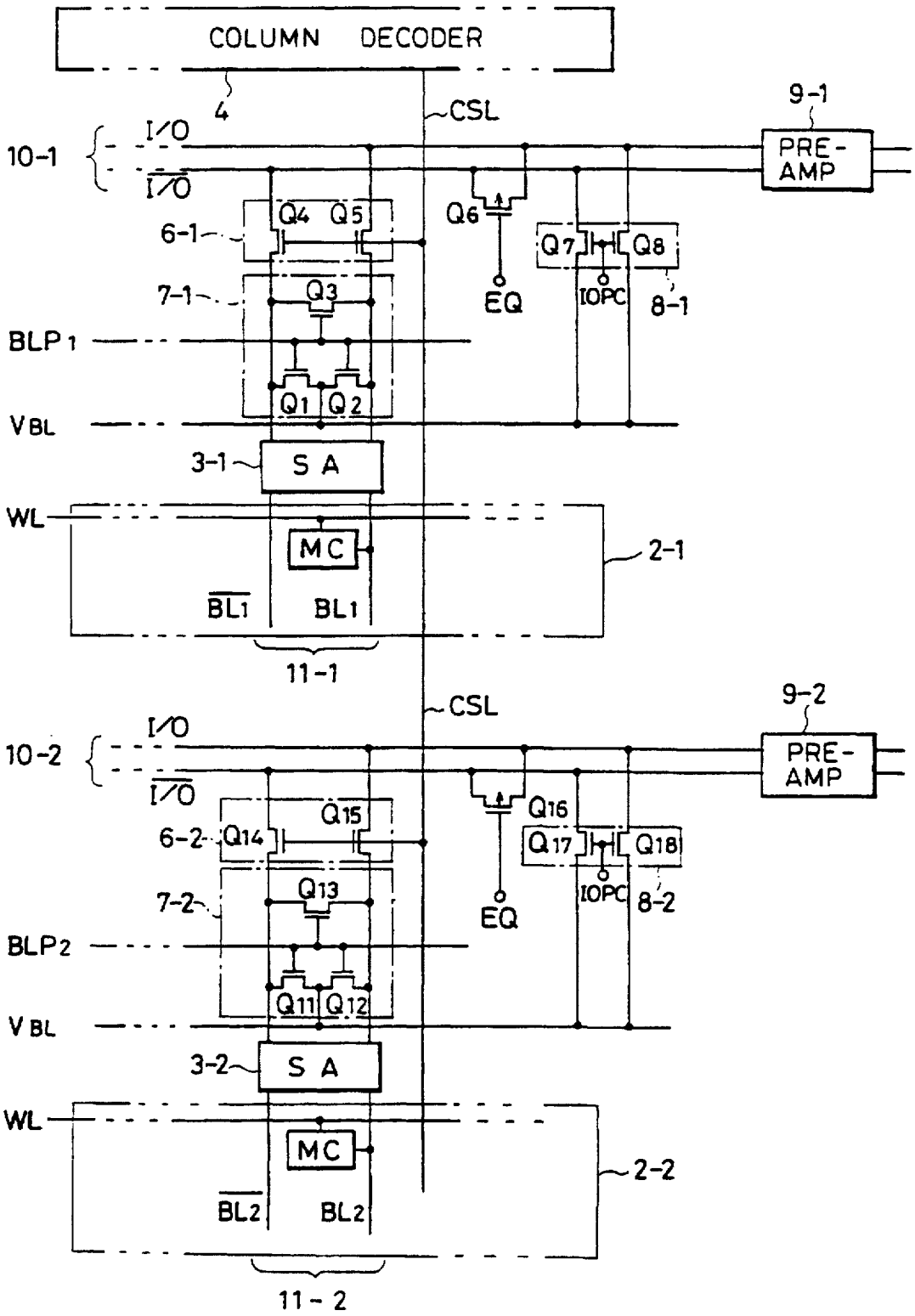
FIG. 3 PRIOR ART
FIG. 3 is a circuit diagram showing in detail portions relating to first and second memory array portions shown in FIG. 2.
Figure 4:
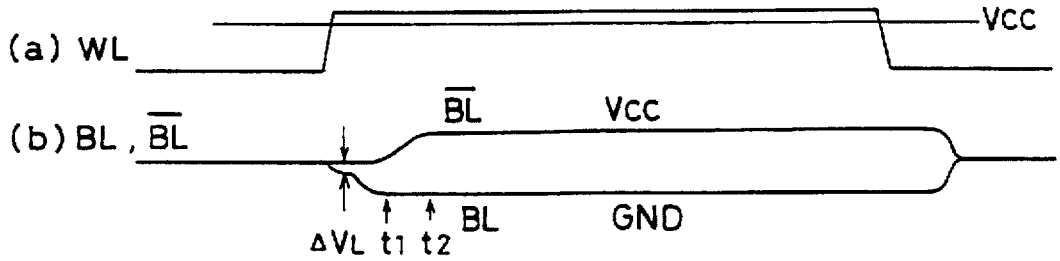
FIG. 4 PRIOR ART
FIGS. 4(a)–(b) are a timing chart showing changes in level of a bit line pair in the conventional dynamic RAM.
Figure 5:
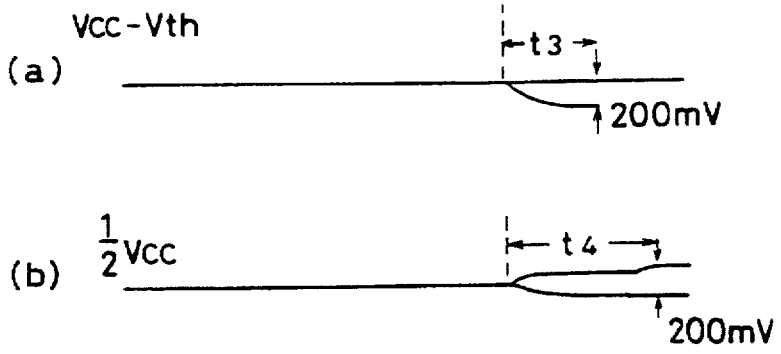
FIG. 5 PRIOR ART
FIGS. 5(a)–(b) are a timing chart showing changes in level of an I/O line pair in the conventional dynamic RAM.
Figure 6:
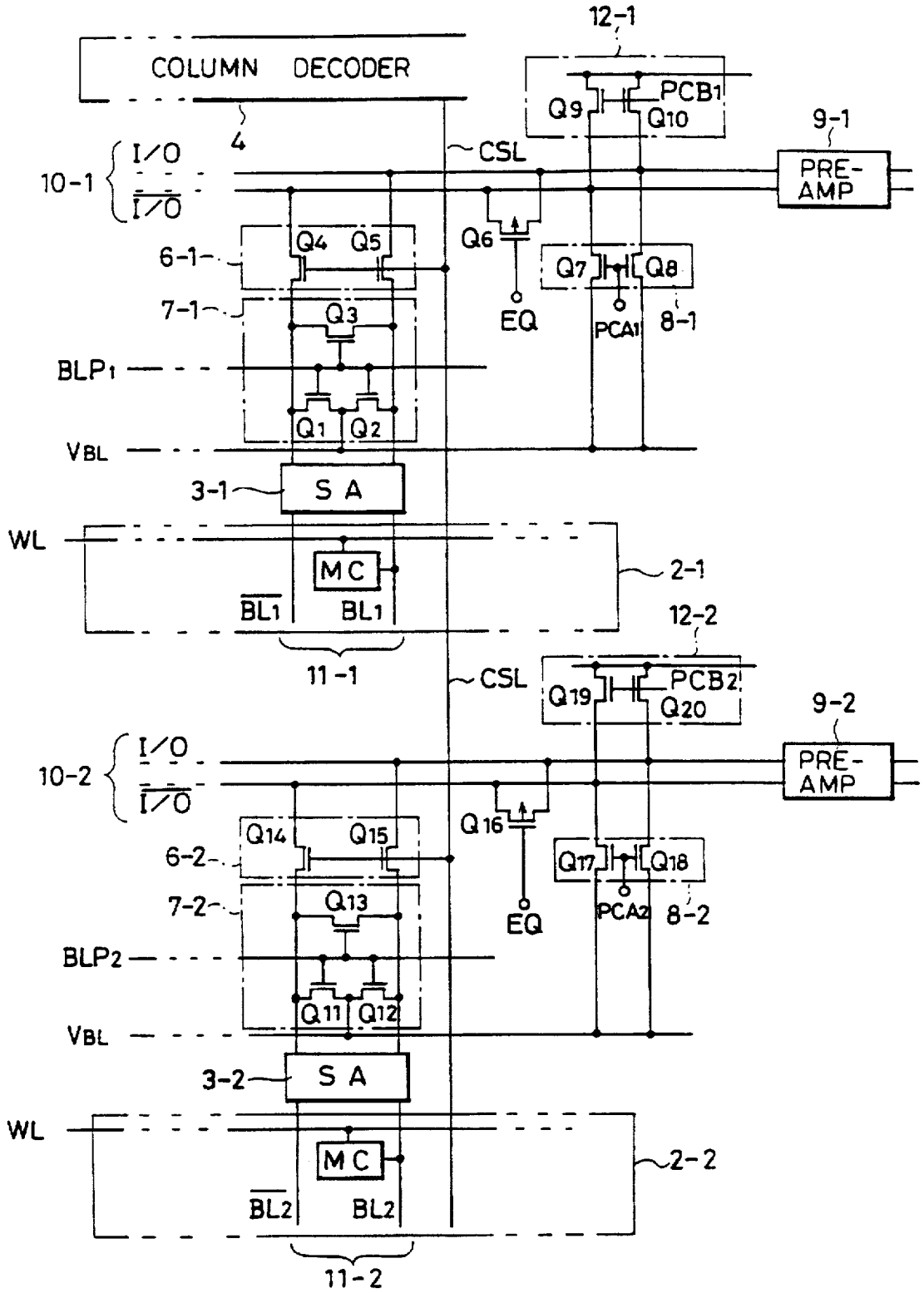
FIG. 6 is a circuit diagram showing in detail portions relating to first and second memory array portions in a dynamic RAM according to one embodiment of the present invention.

FIG. 6 is a circuit diagram showing in detail portions corresponding to the conventional example shown in FIG. 3, of a dynamic RAM of a CSL system according to one embodiment of the present invention, i.e., portions relating to first and second memory array portions 2-1 and 2-2.

The embodiment shown in FIG. 6 is different from the conventional example shown in FIG. 3 in the following points. With regard to common parts of the embodiment and the conventional example, a detailed description thereof will not be repeated here. That is to say, in the embodiment shown in FIG. 6, additional precharge circuits 12-1, 12-2, . . . are provided corresponding to respective I/O line pairs 10-1, 10-2, . . . .

Note a portion of the embodiment of FIG. 6 which relates to first memory array portion 2-1. A second I/O line precharge circuit 12-1 in addition to conventional first I/O line precharge circuit 8-1 is connected to I/O line pair 10-1. This second I/O line precharge circuit 12-1 is constituted by transistors Q9 and Q10 which are turned on/off in response to a clock signal PCB1 applied from an internal signal generating source not shown. When those transistors are turned on in response to clock signal PCB1, I/O line pair 10-1 is precharged to, for example, a potential of $V_{CC}-V_{th}$ ($V_{th}$ is a threshold voltage of transistor Q9, Q10).

Figure 7:
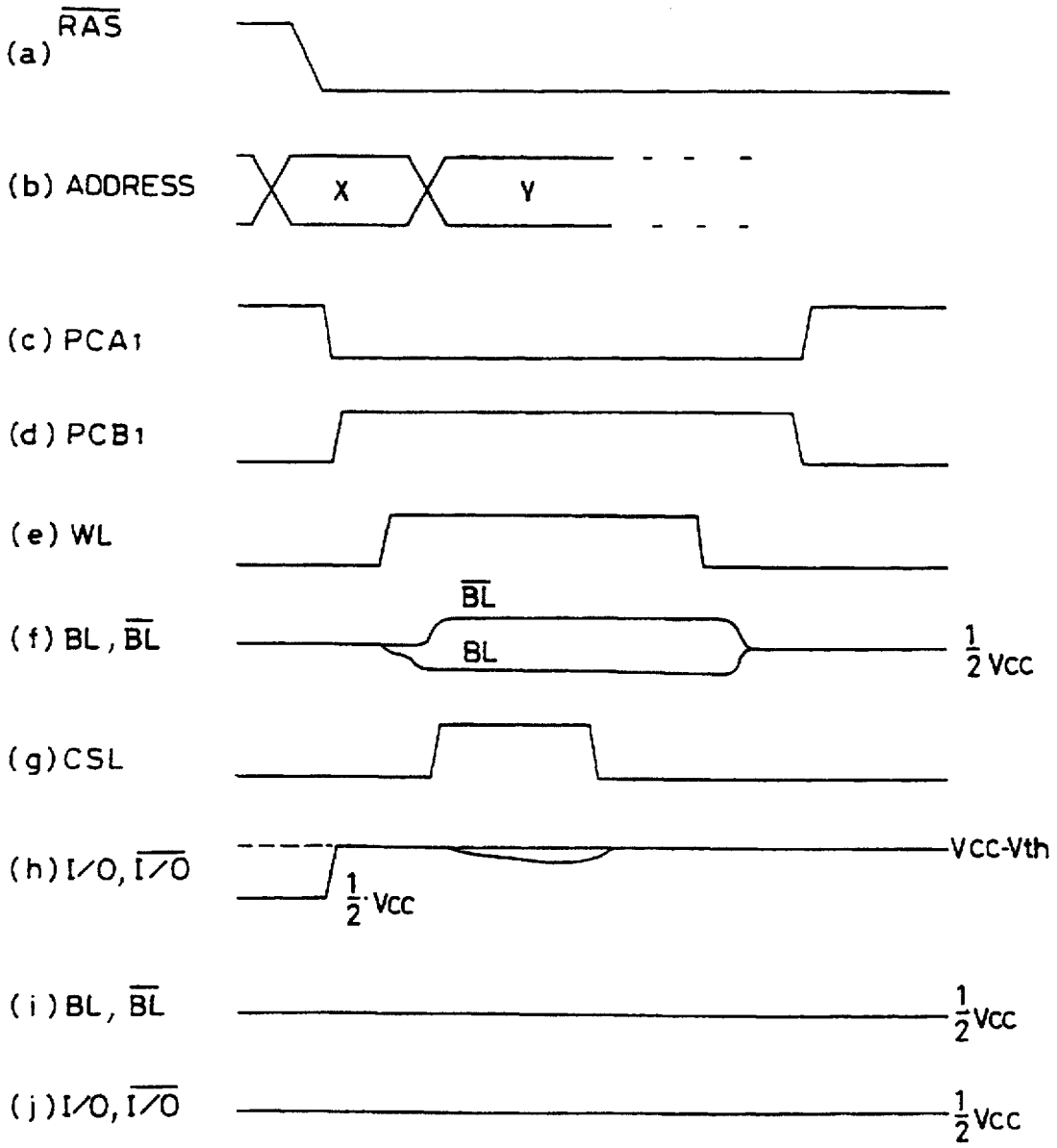
FIGS. 7(a)–(j) are timing charts for use in explaining an operation of the embodiment shown in FIG. 6.

FIG. 7 is a timing chart for use in explaining an operation of the embodiment shown in FIG. 6. The operation of one embodiment of the present invention will now be described with reference to FIGS. 6 and 7. The following description is applied to a case where first memory array portion 2-1 shown in FIG. 6 is accessed (activated), whereas second memory array portion 2-2 is not accessed.

First, in a standby period, a potential on a CSL line (FIG. 7(g)) of FIG. 6 is at a logic low level, and a bit line pair and an I/O line pair are separated from each other by a gate circuit in any of the memory array portions. Bit line pair precharge circuits 7-1 and 7-2 respond to clock signals BLP1 and BLP2 to operate in the same manner as in the case of the example of FIG. 3 and to precharge bit line pairs 11-1 and 11-2 in the respective memory array portions to $V_{BL}=\frac{1}{2}\cdot V_{CC}$.

In a standby mode, clock signals PCA1 and PCA2 are at a logic high level, and I/O line precharge circuits 8-1 and 8-2 in the respective memory array portions operate in the same manner as in the case of the example of FIG. 3 and precharge I/O line pairs 10-1 and 10-2 of the respective memory array portions to $V_{BL}=\frac{1}{2}\cdot V_{CC}$.

Now, an RAS signal (FIG. 7(a)) falls, and a row (X) address is first accepted in row decoder 5 (FIG. 7(b)). In accordance with specific higher order bits of the accepted row address, a detection circuit not shown first detects which one of the plurality of memory array portions is to be activated. In response to the detection of the memory array portion to be activated, clock signal PCA1 corresponding to memory array portion 2-1 to be activated falls (FIG. 7(c)), and at the same time, clock signal PCB1 rises (FIG. 7(d)). As a result, in memory array portion 2-1 to be accessed, precharge circuit 8-1 is inactivated while precharge circuit 12-1 is activated, so that a potential on I/O line pair 10-1 rises from the level of $\frac{1}{2}\cdot V_{CC}$ up to the level of $V_{CC}-V_{th}$. If memory array portion 2-1 has been already accessed in a preceding reading operation so that this memory array portion 2-1 is successively accessed, the potential on I/O line pair 10-1 is successively kept at the level $V_{CC}-V_{th}$ as shown by a broken line of FIG. 7(h).

In the other memory array portion 2-2 which is not accessed, clock signal PCA2 is at a logic high level, while clock signal PCB2 at a logic low level, and a potential on I/O line pair 10-2 is kept at the level of $\frac{1}{2}\cdot V_{CC}$ (FIG. 7(j)).

Now, if a potential on word line WL(FIG. 7(e)) corresponding to memory cell MC from which data is to be read rises, then the data stored in the memory cell is read out onto bit line pair 11-1, so that a potential difference is produced between the paired bit lines (FIG. 7(f)). This potential difference is amplified by sense amplifier 3-1.

Then, if a column (Y) address is accepted into column decoder 4 (FIG. 7(b)), then a potential on a corresponding CSL line (FIG. 7(g)) is raised to a logic high level, so that transistors Q4 and Q5 constituting gate 6-1 are turned on. As a result, the data on bit line pair 11-1 is transferred via gate 6-1 onto I/O line pair 10-1, so that a potential on the I/O line of the I/O line pair is lowered via gate 6-1 by a potential on bit line BL1 being at a logic low level (FIG. 7(h)).

In second memory array portion 2-2 which is not accessed, each clock signal retains the same state as in the standby period, and both of bit line pair 11-2 and I/O line pair 10-2 remain precharged to $V_{BL}=\frac{1}{2}\cdot V_{CC}$ (FIG. 7(i) and (j)). In this state, even if a CSL output (FIG. 7(g)) applied from column decoder 4 rises to a logic high level and thus gate 6-2 is opened, no current flows between bit line pair 11-2 and I/O line pair 10-2.

As described above, according to the foregoing embodiment, while additional precharge circuits 12-1, 12-2, . . . are provided and only the I/O line pair of the memory array portion to be accessed is precharged to the level of $V_{CC}-V_{th}$, the I/O line pair of the memory array portion not to be accessed is precharged to the level of $V_{BL}=\frac{1}{2}\cdot V_{CC}$ which is the same level as the bit line pair. Accordingly, in also an RAM of a CSL system in which gates of a plurality of memory array portions are opened at one time in response to an output of a single CSL line, it is possible to achieve a faster data reading operation and also prevent unnecessary currents from flowing through the unaccessed memory array portions. In addition, since the RAM employs the CSL system, it is unnecessary to provide a column decoder for each memory array portion, and an increase in chip area can be prevented. Further, since a precharge potential of the I/O line pair in the memory array portion to be accessed is set to a potential other than $\frac{1}{2}\cdot V_{CC}$, it is also possible to reduce load imposed on the $\frac{1}{2}\cdot V_{CC}$ potential generating circuit.

While the precharge potential of the I/O line pair of the memory array portion to be accessed is set to the potential level of $V_{CC}-V_{th}$ in the foregoing embodiment, the precharge potential in this case is not limited to that level and may be any potential between, e.g., $\frac{1}{2}\cdot V_{CC}$ and $V_{CC}$. Such a precharge potential can be freely set in actual circuit design by making transistors Q9, Q10, Q19 and Q20 be formed of p channel transistors or by boosting clock signal PCA1 in access time.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device of a column select line system, comprising:

a memory array divided into a plurality of memory array portions;

means for selectively accessing any of said plurality of memory array portions;

a plurality of bit line pairs for reading data for respective columns from each of said memory array portions;

an I/O line pair selectively connected with the plurality of bit line pairs of each of said memory array portions; and means provided for each said memory array portion i) for precharging said bit line pairs and said I/O line pair to a potential ½Vcc in non-access time of said memory array portion, and ii) for precharging said bit line pairs to the potential of ½Vcc and said I/O line pair to a potential different from ½Vcc in access time of said memory array.

2. The semiconductor memory device according to claim 1, wherein said means for precharging precharges said I/O line pair to a higher potential than the potential of said bit line pairs in access time of said memory array portion.

3. A random access memory, comprising:

a plurality of memory array portions arranged to constitute one memory array as a whole, each of said plurality of memory array portions including a plurality of memory cells arranged two-dimensionally in rows and columns;

a plurality of bit line pairs provided for each said memory array portion for reading data from respective columns of said memory cells constituting each said memory array portion;

a plurality of amplifying means for amplifying, respectively, data read via said plurality of bit line pairs;

an I/O line pair provided for each said memory array portion for receiving data from said plurality of bit line pairs;

a plurality of gate means provided for each said memory array portion for connecting said plurality of bit line pairs to said I/O line pair;

means responsive to a row address signal for activating any of said plurality of memory array portions so as to read data from any of said memory cells included in the activated memory array portion onto a corresponding one of said bit line pairs;

column decoder means responsive to a column address signal for controlling, in common, opening and closing of said plurality of gate means corresponding to a common column address in the respective memory array portions;

first precharge means provided for each said memory array portion for precharging said bit line pairs to a first potential independently of access time/non-access time of said memory array portion; and second precharge means provided for each said memory array portion for precharging said I/O line pair to said first potential in non-access time of said memory array portion and for precharging said I/O line pair to a second potential different from said first potential in access time of said memory array portion.

4. The random access memory according to claim 3, wherein said second potential is set to be higher than said first potential.

5. The random access memory according to claim 4, wherein said first potential is ½ of a predetermined supply potential, and said second potential is an arbitrary potential between said first potential and said supply potential.

*6. A random access memory having a standby state and an active state, comprising:*

*a memory array having a plurality of memory array portions each including a bit line pair, each of said plurality of memory array portions having an access state and a nonaccess state, said plurality of memory array portions being in said nonaccess state when said random access memory is in said standby state, a memory array portion of said plurality of memory array portions being in said access state and other memory array portion of said plurality of memory array portions being in said nonaccess state when said random access memory is in said active state;*

*a plurality of I/O line pairs corresponding to said plurality of memory array portions;*

*a column select line provided in common to said plurality of memory array portions;*

*a plurality of gate means corresponding to said plurality of memory array portions, said plurality of gate means commonly coupled to said column select line, each of said gate means responsive to a signal transmitted by said column select line for coupling the bit line pair included in a corresponding memory array portion to the I/O line pair corresponding to said corresponding memory array portion;*

*a plurality of first charging means coupled to said plurality of I/O line pairs respectively, each of said plurality of first charging means for providing a first potential to the I/O line pair coupled to said each first charging means when the memory array portion corresponding to said I/O line pair coupled to said each first charging means is in said nonaccess state, said first potential having a same potential level as a precharge potential for precharging said bit line pairs;*

*a plurality of second charging means coupled to said plurality of I/O line pairs respectively, each of said plurality of second charging means for precharging the I/O line pair coupled to said each second charging means to a second potential when the memory array portion corresponding to said I/O line pair coupled to said each second charging means is in said access state, said second potential being different from said first potential; and*

*a plurality of preamplifiers corresponding to said plurality of I/O line pairs respectively, each of said plurality of preamplifiers for outputting data responsive to a potential difference appearing on a corresponding I/O line pairs, said potential difference being smaller than a difference between power supply potential and ground potential.*

*7. A random access memory having a standby state and an active state, comprising:*

*a memory array having a plurality of memory array portions each including a bit line pair, each of said plurality of memory array portions having an access state and a nonaccess state, said plurality of memory array portions being in said nonaccess state when said random access memory is in said standby state, a memory array portion of said plurality of memory array portions being in said access state and other memory array portion of said plurality of memory array portions being in said nonaccess state when said random access memory is in said active state;*

*a plurality of I/O line pairs corresponding to said plurality of memory array portions;*

*a column select line provided in common to said plurality of memory array portions;*

*a plurality of gate means corresponding to said plurality of memory array portions, said plurality of gate means commonly coupled to said column select line, each of said gate means responsive to a signal transmitted by said column select line for coupling the bit line pair included in a corresponding memory array portion to the I/O line pair corresponding to said corresponding memory array portion;*

*a plurality of charging means coupled to said plurality of I/O line pairs respectively, each of said plurality of charging means for providing a first potential to the I/O line pair coupled to said each charging means when the memory array portion corresponding to said I/O line pair coupled to said each charging means is in said nonaccess state, said first potential having a same potential level as a precharge potential for precharging said bit line pairs; and*

*a plurality of load means coupled to said plurality of I/O line pairs respectively, each of said plurality of load means for providing a second potential to the I/O line pair coupled to said each load means during the memory array portion corresponding to said I/O line pair coupled to said each load means is in said access state, said second Potential being different from said first potential.*

*8. A random access memory having a standby state and an active state, comprising:*

*a memory array having a plurality of memory array portions each including a bit line pair, each of said plurality of memory array portions having an access state and a nonaccess state, said plurality of memory array portions being in said nonaccess state when said random access memory is in said standby state, a memory array portion of said plurality of memory array portions being in said access state and other memory array portion of said plurality of memory array portions being in said nonaccess state when said random access memory is in said active state;*

*a plurality of I/O line pairs corresponding to said plurality of memory array portions;*

*a column select line provided in common to said plurality of memory array portions;*

*a plurality of gate means corresponding to said plurality of memory array portions, said plurality of gate means commonly coupled to said column select line, each of said gate means responsive to a signal transmitted by said column select line for coupling the bit line pair included in a corresponding memory array portion to the I/O line pair corresponding to said corresponding memory array portion;*

*a plurality of first charging means coupled to said plurality of I/O line pairs respectively, each of said plurality of first charging means for providing a first potential to the I/O line pair coupled to said each first charging means when the memory array portion corresponding to said I/O line pair coupled to said each first charging means is in said nonaccess state, said first potential having a same potential level as a precharge potential for precharging said bit line pairs; and*

*a plurality of second charging circuits corresponding to said plurality of I/O line pairs respectively, each of said plurality of second charging circuits including a first N channel MOS transistor and a second N channel MOS transistor, said first N channel MOS transistor coupled between a power supply node and one I/O line of a corresponding I/O line pair, said second N channel MOS transistor coupled between said power supply node and another I/O line of said corresponding I/O line pair, said first and second MOS transistor turned on for precharging said corresponding I/O line pair to a second potential when the memory array portion corresponding to said corresponding I/O line pair is in said access state, said second potential being a potential which is lower than a power supply potential provided to said power supply node by a threshold voltage of said first and second N channel MOS transistors.*

* * * * *